(12) United States Patent
Kim et al.

(10) Patent No.: US 7,992,619 B2
(45) Date of Patent: Aug. 9, 2011

(54) HOT PRESSING TOOL AND HOT PRESSING APPARATUS HAVING THE SAME

(75) Inventors: Tae Gyu Kim, Hwaseong-si (KR); Dong-Won Kim, Cheonan-si (KR); Il Kwon Hwang, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 503 days.

(21) Appl. No.: 11/395,260

(22) Filed: Apr. 3, 2006

(65) Prior Publication Data
US 2007/0051251 A1    Mar. 8, 2007

(30) Foreign Application Priority Data
Sep. 8, 2005  (KR) .................. 10-2005 -0083698

(51) Int. Cl.
  *B32B 37/00*  (2006.01)
(52) U.S. Cl. ................... 156/583.1; 156/581
(58) Field of Classification Search .......... 156/580, 156/581, 583.1, 228; 100/315, 320, 321, 100/258 A, 258 R
See application file for complete search history.

(56) References Cited

U.S. PATENT DOCUMENTS

| | | | | |
|---|---|---|---|---|
| 4,743,333 A | * | 5/1988 | Forthmann | 156/359 |
| 5,913,998 A | * | 6/1999 | Butler et al. | 156/245 |
| 6,637,491 B2 | * | 10/2003 | Massey et al. | 156/581 |
| 6,739,370 B2 | * | 5/2004 | Melheim | 156/581 |
| 2001/0018948 A1 | * | 9/2001 | Tada et al. | 156/228 |
| 2002/0124933 A1 | * | 9/2002 | Nagaoka | 156/89.11 |

FOREIGN PATENT DOCUMENTS

| | | |
|---|---|---|
| JP | 6-283568 | 10/1994 |
| JP | 2002-026494 | 1/2002 |
| JP | 2002-33352 | 1/2002 |
| JP | 2003-289090 | 10/2003 |
| JP | 2004-29576 | 1/2004 |
| JP | 2004-80055 | 3/2004 |

* cited by examiner

*Primary Examiner* — James Sells
(74) *Attorney, Agent, or Firm* — Staas & Halsey LLP

(57) ABSTRACT

The present invention relates to a hot pressing tool and a hot pressing apparatus having the same. According to the present invention, a hot pressing head attaching an anisotropic conductive film (ACF) on a liquid crystal display (LCD) substrate and a heater block supplying heat to the hot pressing head have the same thermal expansion coefficient, and the heater block is provided with a hot pressing tool connected to a moving block by connection units. Also, there is provided a hot pressing apparatus, including the hot pressing tool, which is provided with a support capable of attaching the LCD substrate on the ACF and a transfer instrument. Thus, according to the present invention, the operation can continue with almost no deterioration of the oblateness of the hot pressing head. Also, since the hot pressing apparatus has the structure of connecting the heater block and the hot pressing head together simply by the combination bolts with no need for adjustment bolts, it can be easily manufactured. Also, it is possible to prevent the decrease of work efficiency, and damage to the adjustment bolts caused by excessive use of the adjustment bolts.

13 Claims, 6 Drawing Sheets

HOT PRESSING TOOL AND HOT PRESSING APPARATUS HAVING THE SAME

CROSS-REFERENCE TO RELATED APPLICATIONS

This application claims the benefit of Korean Application No. 10-2005-0083698, filed Sep. 8, 2005, in the Korean Intellectual Property Office, the disclosure of which is incorporated herein by reference.

BACKGROUND OF THE INVENTION

1. Field of the Invention

The present invention relates to a hot pressing tool and hot pressing apparatus having the same, and more particularly, to an easily manufactured hot pressing tool which does not need an adjustment bolt due to reducing the thermal deformation, and a hot pressing apparatus having the same.

2. Description of the Related Art

A flat panel display which is small, lightweight, and has improved performance is in great demand, especially in the recently rapidly developing field of semiconductor technology. Among the flat panel displays with the qualities described above, liquid crystal displays (hereinafter, LCD) recently are in the spotlight and have advantages such as being small sized, lightweight, and having low power consumption. Thus, LCDs have been notably in the spotlight as an alternative means to overcome the disadvantages of conventional cathode ray tubes (hereinafter, CRT). Also, LCDs are currently provided and used for almost all information processing equipment needing display devices. Among the process of manufacturing LCDs as above, the assembly processing of connecting an LCD substrate and a tape carrier package (hereinafter, TCP) including a driving integrated circuit (IC) for driving the LCD is important for the reliability and the quality of LCDs.

Generally, a hot pressing and attaching method using an anisotropic conductive film (hereinafter, ACF) is used in the assembly process of connecting the LCD substrate and TCP. In this instance, since the TCP and LCD substrate are pressed together by hot pressing in a state where the tip of an attach equipment or the hot pressing head thereof is maintained at between 300 and 400° C., it is very hard to maintain the oblateness of the tip portion. In other words, the assembly process needs extremely precise thermal deformation control.

The above will be further described in detail with reference to FIGS. 1 and 2. FIG. 1 is a perspective view illustrating a conventional hot pressing tool, and FIG. 2 is a side view illustrating the conventional hot pressing tool. As illustrated in the figures, a conventional hot pressing tool 1 includes an adjustment block 10 moving up and down by a transfer instrument (not shown), a hot pressing head 40 making contact with the ACF of the LCD substrate and applying an electric current and performing the attachment, a head support 20 provided with the hot pressing head 40, and adjustment bolts 30 connecting the head support 20 and the adjustment block 10. The hot pressing head 40 is coupled with the head support 20 by combination bolts 26.

The head support 20 has heaters 25 embedded to heat the head support 20 and the hot pressing head 40. Generally, the head support 20 is formed using a beryllium copper alloy to enhance its thermal conductivity, and the hot pressing head 40 is formed using something different than the beryllium copper alloy that is used to form the head support 40 to enhance pressure strength.

The operation of the conventional hot pressing apparatus constructed as above will be described below.

An LCD substrate 60 is first provided on a support 50, and a transfer instrument later operates by control of a user to move the hot pressing head 40 down. At this time, the hot pressing head 40 is heated to a high temperature of more than 300° C. An ACF 62 is interposed between a TCP 61 and the LCD substrate 60 and the hot pressing head 40 presses the TCP 61 and the LCD substrate 60 for several seconds or dozens of seconds. In this manner, hot pressing is performed. After this, the hot pressing head 40 is moved up again by the transfer instrument. After removal of the vacuum state which provides adhesion, the LCD 60 substrate attached with the TCP 61 is taken out.

However, the conventional art as above has the following problems. Thermal deformation is a problem because the hot pressing head 40 of the hot pressing tool 1 presses the TCP 61 and the LCD substrate 60 at the state of a high temperature of more than 300° C. Thus, it is very hard to maintain the oblateness of the hot pressing head 40 because of the thermal deformation. Also, the compression precision of the TCP 61 and the LCD substrate 60 is not obtained because of the thermal deformation. This may cause a bad contact. The bad contact may result in the malfunction or error of an electric part. Consequently, the reliability of the product is deteriorated.

Also, the head support 20 and the hot pressing head 40 are formed using different materials. Thus, the oblateness is easily deteriorated because of their different thermal expansion coefficients. A thermal expansion coefficient of beryllium copper alloy is approximately below 17.5 μm/m° C. On the other hand, a thermal expansion coefficient of the hot pressing head 40 formed using a steel alloy is approximately between 10 and 12 μm/m° C. Accordingly, the oblateness error occurs because of the degree of different thermal deformation caused by different thermal expansion at the same temperature. The difference of thermal deformation coefficient between the beryllium copper alloy and the steel alloy is the underlying cause of a bad contact between the TCP, ACF and LCD.

Also, although the adjustment bolts 30 are provided to readjust the oblateness when thermal deformation occurs, it is very inconvenient to measure the oblateness and readjust the same through the adjustment bolts 30. Also, if the oblateness is measured and readjusted through the adjustment bolts 30 every process, it does not only decrease productivity, but also increases the cost of production because working hours get longer. Also, excessive adjustment may damage the adjustment bolt 30.

SUMMARY OF THE INVENTION

Additional aspects and/or advantages of the invention will be set forth in part in the description which follows and, in part, will be apparent from the description, or may be learned by practice of the invention.

The present invention is conceived to solve the aforementioned problems. Thus, the present invention provides a hot pressing tool which maintains the oblateness in hot pressing without an additional member, thereby preventing a bad contact, and a hot pressing apparatus having the same.

The present invention also provides a hot pressing tool which can prevent damage to an adjustment bolt caused by the excessive manipulation of the adjustment bolt, or prevent the decrease of productivity or long working hours since an adjustment bolt is not needed due to the reduction of thermal deformation, and a hot pressing apparatus having the same.

The present invention also provides an easily manufactured hot pressing tool which can reduce the cost of production since a combination bolt is not needed, and a hot pressing apparatus having the same.

To achieve the aforementioned objectives of the present invention, according to an aspect of the present invention, there is provided a hot pressing tool, including: a hot pressing head attaching an ACF on an LCD substrate; a heater block having the same thermal expansion coefficient as the hot pressing head, formed integrated with the hot pressing head and including heaters; a moving block capable of moving up and down; and a connection unit connecting the heater block and the moving block. The hot pressing head and the heater block are made of the same material according to an embodiment of the present invention. Stainless steel or ceramic may be used for the material.

Productivity may be improved since the hot pressing head and the heater block are integrally formed and manufactured by molding together and thus, prevents excessive use of the adjustment bolts. The moving block and the heater block are spaced apart from each other and connected to each other by the connection units. An adjustment bolt, which is interposed between the moving block and the heater block to adjust the spaced interval, for adjusting the oblateness of the hot pressing head may be used for the connection unit.

According to another aspect of the present invention, there is provided a hot pressing apparatus, including: a support supporting a LCD substrate; a hot pressing head attaching an ACF on the LCD substrate; a heater block having the same thermal expansion coefficient to the hot pressing head, formed integrated therewith, and including heaters; a moving block provided to be spaced apart from the heater block; and a transfer instrument moving the moving block up and down. The hot pressing head and the heater block are integrally formed. The moving block and the heater block are spaced apart from each other and connected to each other by the connection units. An adjustment bolt which is interposed between the moving block and the heater block to adjust the spaced interval, thereby adjusting the oblateness of the hot pressing head, may be used for the connection unit.

Since the heater block and the hot pressing head have the same thermal expansion coefficient, the thermal deformation thereof is also the same at the same temperature. Accordingly, the operation can continue with almost no deterioration of the oblateness of the hot pressing head. In addition, since the hot pressing apparatus has the structure of connecting the heater block and the hot pressing head simply by combination bolts without adjustment bolts, it can be easily manufactured. Also, it is possible to prevent the decrease of work efficiency, and damage to the adjustment bolts, caused by the excessive use of the adjustment bolts.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE PREFERRED EMBODIMENTS

Figure 1:
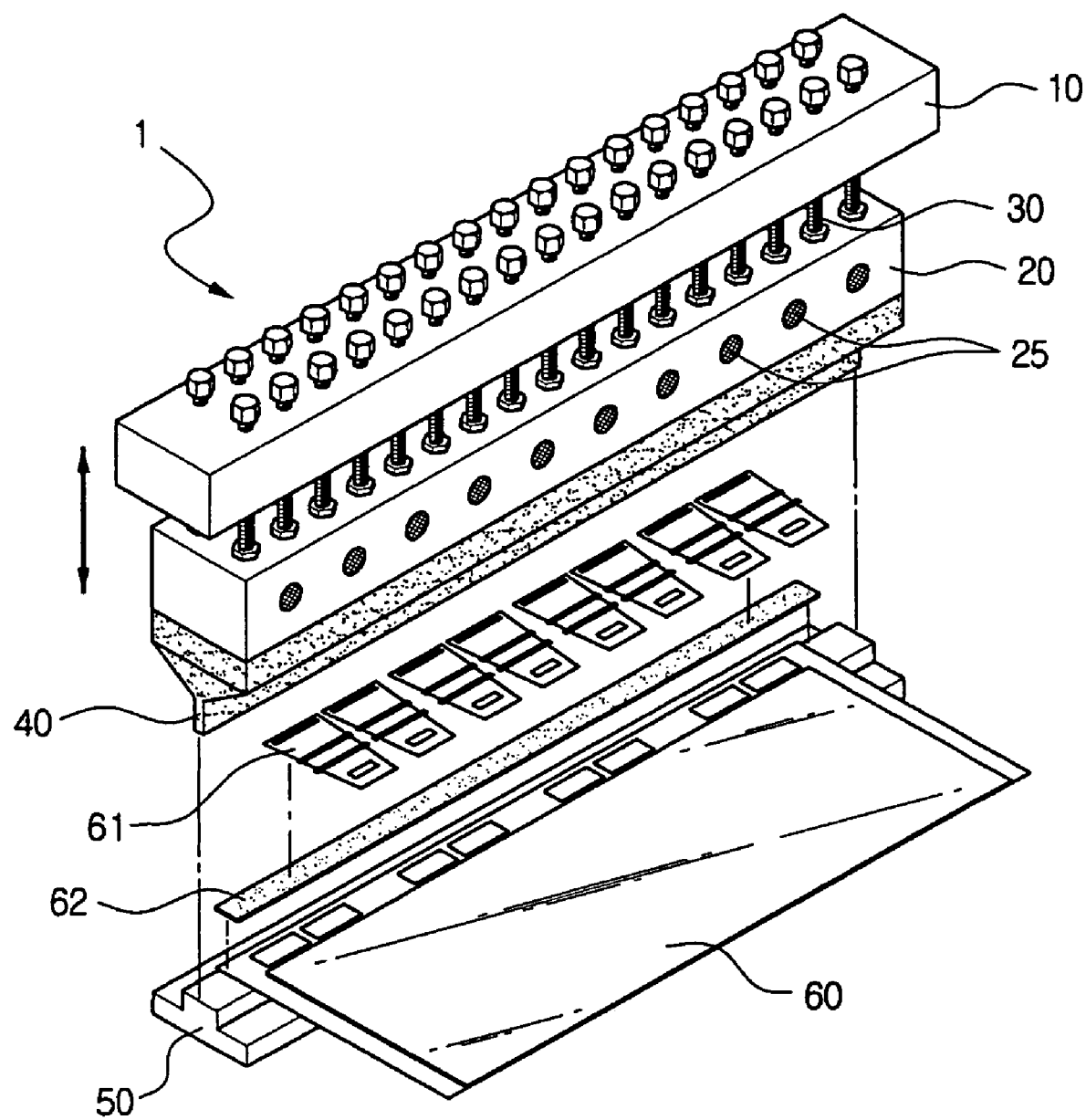
FIG. 1 is a perspective view illustrating a conventional hot pressing tool.
Figure 2:
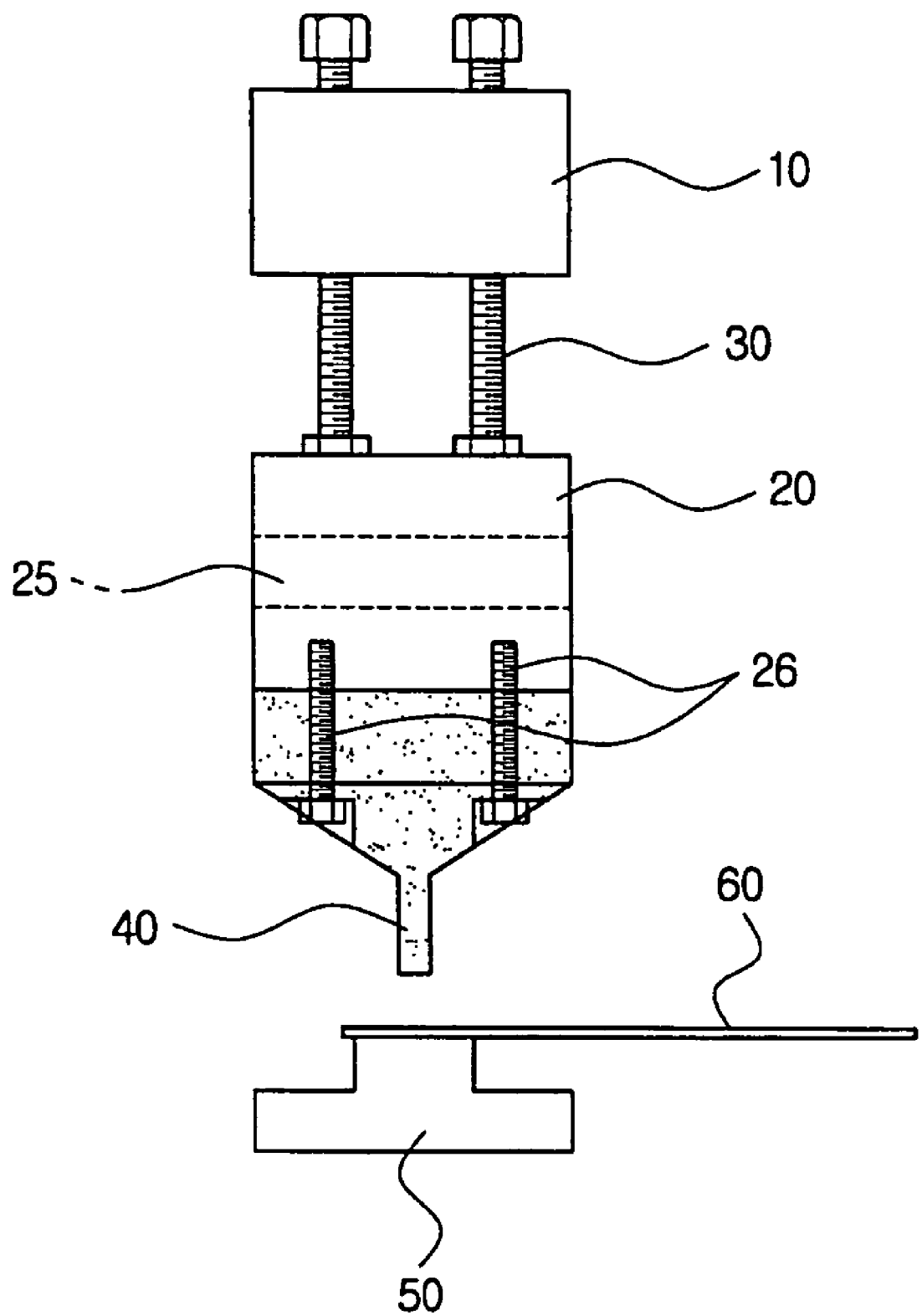
FIG. 2 is a side view illustrating the conventional hot pressing tool.

Reference will now be made in detail to the embodiments of the present invention, examples of which are illustrated in the accompanying drawings, wherein like reference numerals refer to the like elements throughout. The embodiments are described below to explain the present invention by referring to the figures.

Hereinafter, the exemplary embodiments of the present invention will be described in detail with reference to the accompanying drawings. However, the present invention is not limited thereto or restricted thereby.

Figure 3:
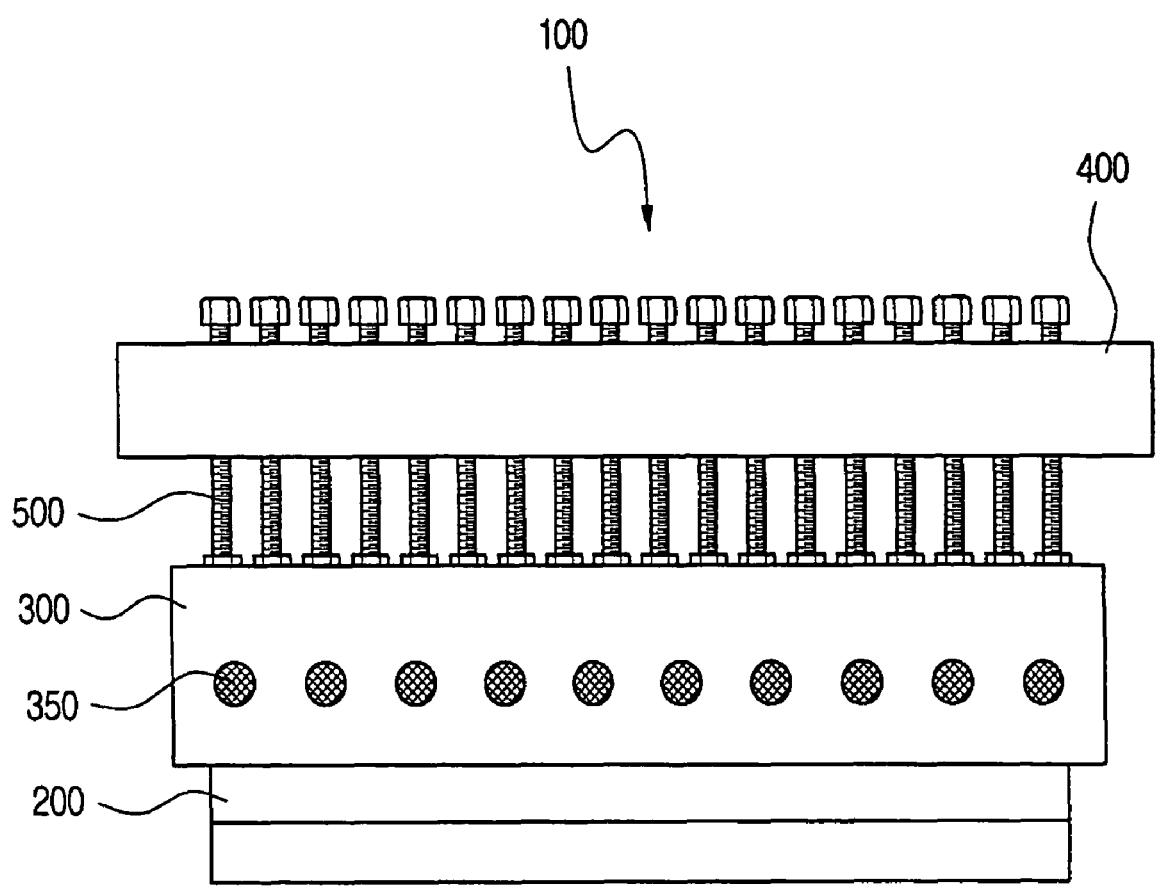
FIG. 3 is a front view illustrating a hot pressing tool according to a first embodiment of the present invention.
Figure 4:
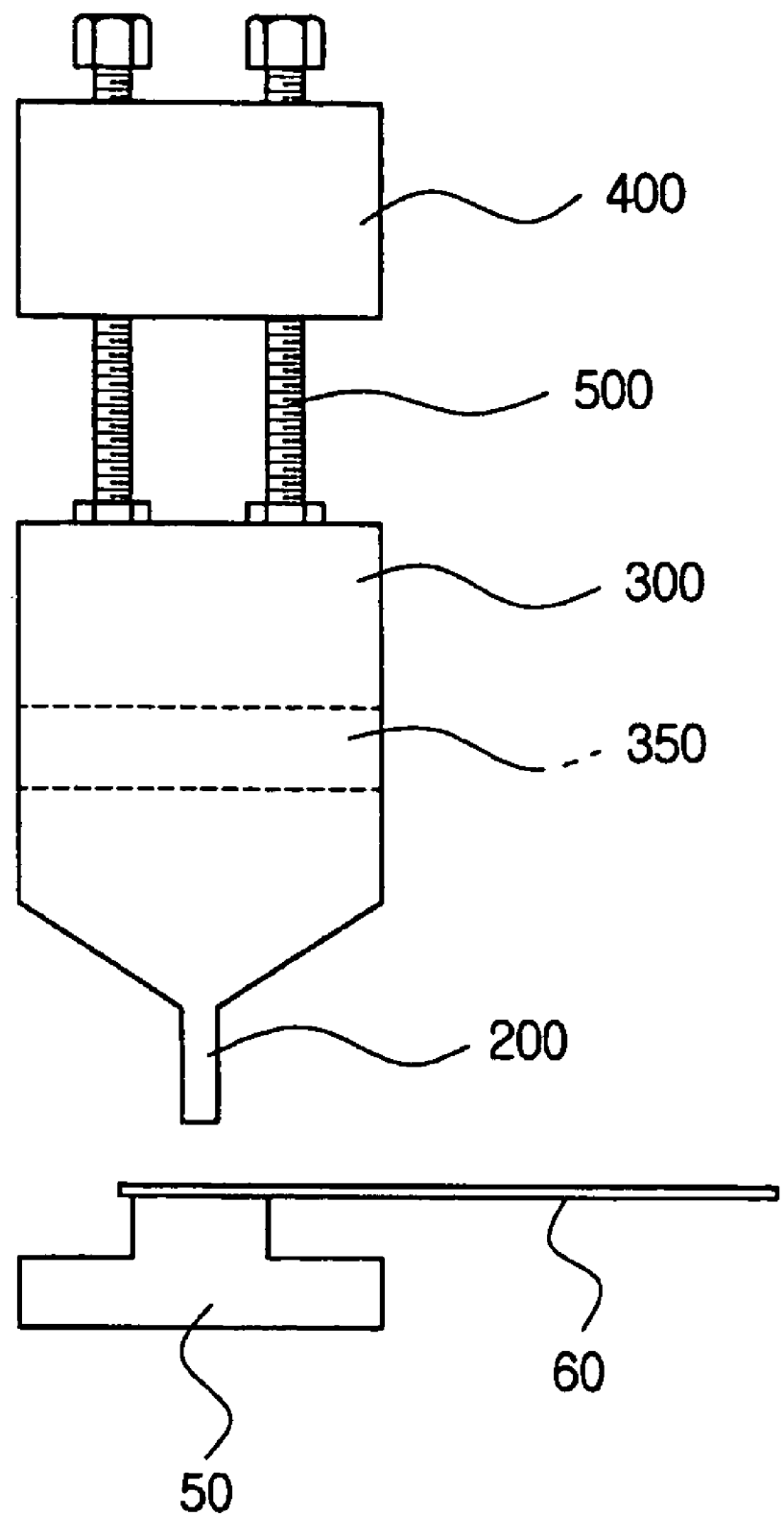
FIG. 4 is a side view illustrating the hot pressing tool according to the first embodiment of the present invention.

FIG. 3 is a front view illustrating a hot pressing tool according to a first embodiment of the present invention, and FIG. 4 is a side view illustrating the hot pressing tool according to the first embodiment of the present invention. As illustrated in the figures, a hot pressing tool 100 of the present invention includes a hot pressing head 200, a heater block 300, a moving block 400, and connection units 500.

The hot pressing head 200 is made of a material of which thermal conductivity is high, so as to transfer heat from the heater block 300 to an LCD substrate. Also, the hot pressing head 200 and the heater block 300 are integrally formed and manufactured by molding together. The side surface front and back surfaces of the hot pressing head 200 are formed to have a certain slope to press the TCP and the LCD substrate, as illustrated in FIG. 4. That is, the hot pressing head 200 is formed in the convergent shape, such that its tip making contact with the LCD substrate may have the proper width for hot pressing to the LCD substrate.

The heater block 300 has heaters 350 embedded and serves to transfer heat to the hot pressing head 200. A plurality of the heaters 350 is inserted in the width direction of the heater block 300. It is preferable that the interval between said plurality of the heaters 350 is maintained to be uniform for uniform heat transmission.

The hot pressing head 200 and the heater block 300 have the same thermal expansion coefficient. Also, it is preferable that the hot pressing head 200 and the heater block 300 are made of the same material. When the hot pressing head 200 and the heater block 300 are made of the same material, the thermal expansion coefficient thereof is also same. Thus, it is possible to reduce deterioration of the oblateness of the hot pressing tool caused by thermal deformation.

The material can be made of stainless steel. The stainless steel is mainly divided into iron-chrome ferrite stainless steel and iron-nickel-chrome austenite stainless steel, and the present invention may include any type of stainless steel. Stainless steel has excellent thermal conductivity for hot pressing and also has good anti-fatigue against repetitive stress. Namely, the stainless steel is a material having both thermal conductivity and antiabrasion qualities which enable it to endure repeated collisions. In this instance, the thermal conductivity is a roll of the heater block 300 and the antiabrasion is a role of the hot pressing head 200.

The material of the heater block 300 and the hot pressing head 200 is not limited to the stainless steel. If a material has good thermal conductivity and little thermal deformation and anticorrosiveness, that material may be used. Also, a material having sufficient mechanical strength even at the high temperature, can be used. For example, a ceramic like silicon carbide (SiC) or tungsten carbide (WC) can be used. In the present specification, the ceramic indicates all types of nonmetal inorganic solid materials, which are manufactured by a heat treatment at a high temperature.

The moving block 400 is constructed to be capable of moving up and down by a transfer instrument (not shown). The transfer instrument may use a cylinder using air or oil pressure or may use a motor. The moving block 400 and the heater block 300 are spaced apart from each other to prevent the heat transmission and connected to each other by the connection units 500. This is to make the heat generated from the heaters 350 embedded in the heater block 300 flow only to the hot pressing head 200 and to prevent the heat from flowing to the moving block 400 which wastes heat. Another reason why the heater block 300 and the moving block 400 are spaced apart from each other is to have a space for adjusting the oblateness by using the connection units 500.

An adjustment bolt is used as the connection unit 500. The adjustment bolt passes through the moving block 400 and is coupled with the heater block 300. Namely, the moving block 400 and the heater block 300 are coupled together with a space between each other. The head of the adjustment bolt is protruded on the moving block 400 and constructed to be rotated. The oblateness can be easily adjusted by rotating the head of the adjustment bolt. According to an embodiment of the present invention, the hot pressing head 200 and the heater block 300 are formed using materials having the same thermal expansion coefficient or the same material. Thus, the adjustment bolt is not used as often as in the conventional art. However, when the oblateness needs to be adjusted because of an external shock or deterioration of the oblateness by irregular heating, the adjustment bolt is used.

A hot pressing apparatus according to an embodiment of the present invention is constructed to have the hot pressing tool. The hot pressing apparatus includes, besides the hot pressing tool, a support supporting an LCD substrate, a transfer instrument capable of moving a moving block up and down, and a heating unit connected to a heater contained within a heater block. The present invention is not limited to the hot pressing tool but also relates to the hot pressing apparatus using the hot pressing tool.

Hereinafter, the operations and effects of an embodiment of the present invention will be described. An LCD substrate is first provided on a support, and a transfer instrument later operates by control of a user to move the hot pressing head 200 down. At this time, the hot pressing head 200 has received heat generated from the heaters 350 of the heater block 300 and is heated to a high temperature of more than 300° C. An ACF is interposed between a TCP and the LCD substrate and the hot pressing head 200 presses the TCP and the LCD substrate for several seconds or dozens of seconds. In this manner, hot pressing is performed. After this, the hot pressing head 200 is moved up again by the transfer instrument. After removal of the vacuum state which provides adhesion, the LCD substrate attached with the TCP is taken out. In this instance, since the heater block 300 and the hot pressing head 200 have the same thermal expansion coefficient, the thermal deformation thereof is also the same at the same temperature. Accordingly, the operation can continue with causing almost no deterioration of the oblateness of the hot pressing head 200. However, the adjustment bolt used as the connection unit 500 is used for adjusting the oblateness which may occur due to an external shock or the like.

As described above, according to an embodiment of the present invention, the oblateness can be effectively maintained since the moving block and the hot pressing head are made of materials having the same thermal expansion coefficient. Also, not only work efficiency but also productivity can be improved. Also, since the heater block and the hot pressing head are integrally manufactured, a combination bolt is not needed therebetween. Also, since the heater block and the hot pressing head can be manufactured together, the manufacture thereof can be simplified and the cost of production can be reduced.

Figure 5:
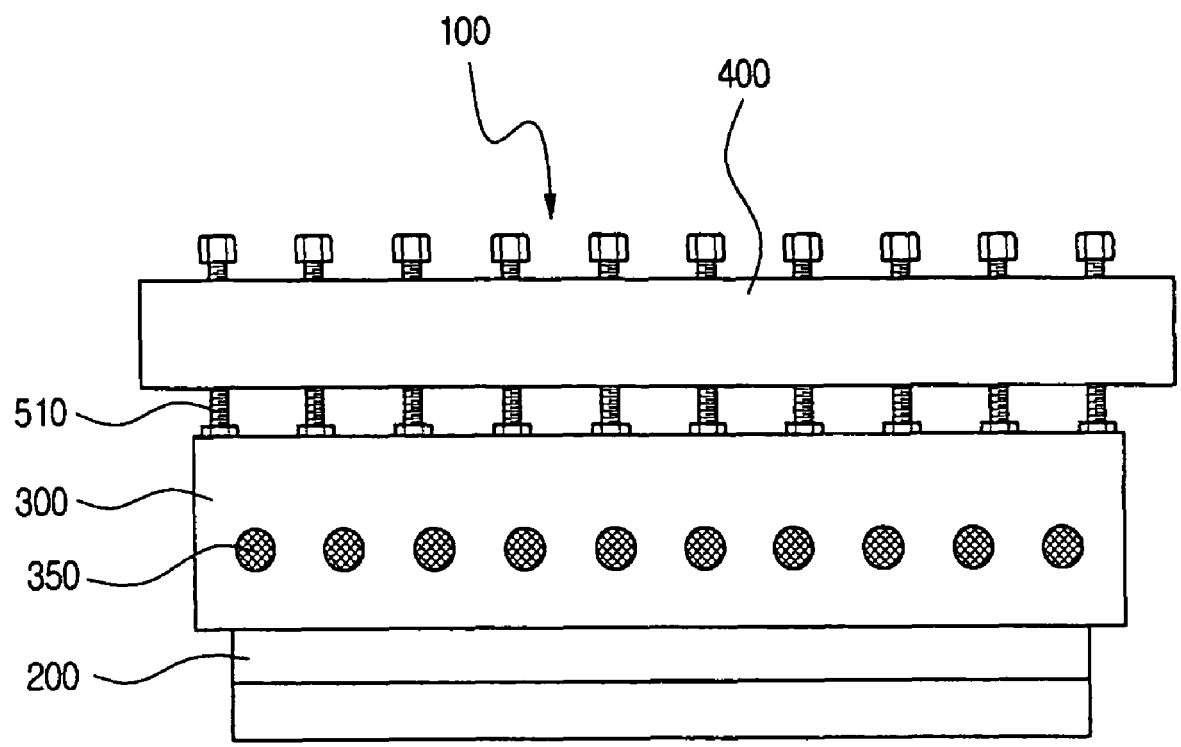
FIG. 5 is a front view illustrating a hot pressing tool according to a second embodiment of the present invention.
Figure 6:
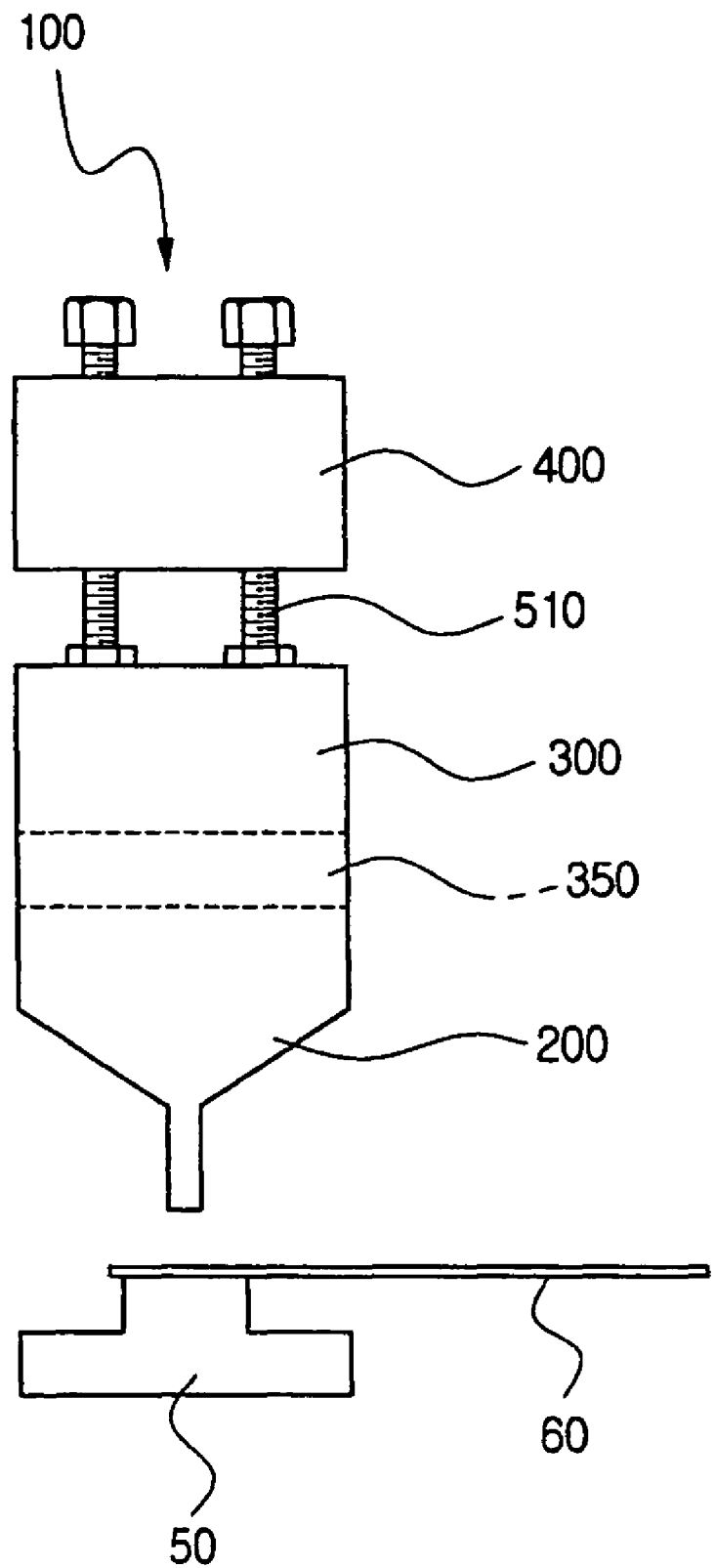
FIG. 6 is a side view illustrating the hot pressing tool according to the second embodiment of the present invention.

FIG. 5 is a front view illustrating a hot pressing tool according to a second embodiment of the present invention, and FIG. 6 is a side view illustrating the hot pressing tool according to the second embodiment of the present invention. As illustrated in the figures, a hot pressing tool 100 of the present invention includes a hot pressing head 200, a heater block 300, a moving block 400, and connection units 510.

In the second embodiment of the present invention, just like in the first embodiment, the hot pressing head 200 is made of a material of which thermal conductivity is high, so as to transfer heat from the heater block 300 to an LCD substrate. Also, the hot pressing head 200 and the heater block 300 are integrally formed and manufactured by molding together. Also, the heater block has heaters 350 embedded and serves to transfer heat to the hot pressing head 200.

The hot pressing head 200 and the hot heater block 300 have the same thermal conductivity and are made of the same material. In the case the hot pressing head 200 and the heater block 300 are made of the same material, the thermal expansion coefficient thereof is also same. Thus, it is possible to reduce deterioration of the oblateness of the hot pressing tool by thermal deformation. Stainless steel may be used for the material, just like in the first embodiment, but the material is not limited thereto.

The moving block 400 is constructed to be capable of moving up and down by a transfer instrument (not shown). The moving block 400 and the heater block 300 are spaced apart from each other to prevent heat transmission and connected to each other by the connection units 510. A general combination bolt, not an adjustment bolt, is used as the connection unit 510.

In the case of the present invention, there is no need to use a conventional adjustment bolt between the moving block 400 and the heater block 300. Thus, the moving block 400 and the heater block 300 may be integrally manufactured. However, the moving block 400 can be spaced apart from the heater block 300, to prevent heat transmission, and connected thereto by the connection units 510. This is to make the heat generated from the heaters 350 embedded in the heater block 300 flow only to the hot pressing head 200 and to prevent the heat from flowing to the moving block 400 so as to not waste heat.

Since the heater block and the hot pressing head have the same thermal expansion coefficient, the thermal deformation thereof is also the same at the same temperature. Accordingly, the operation can continue with almost no deterioration of the oblateness of the hot pressing head. In addition, since the hot pressing apparatus has the structure of connecting the heater block and the hot pressing head simply by the combination bolts and no adjustment bolts, it can be easily manufactured. Also, it is possible to prevent the decrease of work efficiency, and damage to the adjustment bolts caused by excessive use of the adjustment bolt.

According to the present invention, an additional member is not needed to control oblateness and the oblateness is maintained in hot pressing. Thus, a bad contact by a hot pressing tool may not occur.

Also, since thermal deformation is reduced and an adjustment bolt is not needed, it is possible to prevent problems resulted from the use of the adjustment bolt, such as damage to the adjustment bolt, decrease of productivity or long working hours.

Also, since a heater block and a hot pressing head are integrally manufactured, a combination bolt connecting the two parts is not needed. Thus, the manufacture of the heater block and pressing head can be simplified and the cost of production can be reduced.

Although a few embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A hot pressing tool including a moving block connected to a transfer instrument to be capable of moving up and down, the hot pressing tool comprising:
   a hot pressing head attaching an anisotropic conductive film (ACF) on a liquid crystal display (LCD) substrate;
   a heater block having the same thermal expansion coefficient as the hot pressing head and including a plurality of heaters passing through the heater block in a width direction thereof; and
   a connection unit connecting the heater block and the moving block,
   wherein the heater block is fixed to the connection unit,
   wherein a length direction of the connection unit extends in a direction parallel to a line connecting the hot pressing head, the heater block and the moving block,
   wherein the moving block and the heater block are spaced apart from each other and connected to each other by the connection unit, and
   wherein the connection unit is a plurality of adjustment bolts capable of adjusting the interval between the moving block and the heater block, thereby adjusting the oblateness of the hot pressing head, and the adjustment bolts are arranged in a line perpendicular to the length direction.

2. The hot pressing tool of claim 1, wherein the hot pressing head and the heater block are made of the same material.

3. The hot pressing tool of claim 2, wherein the hot pressing head and the heater block are made of stainless steel.

4. The hot pressing tool of claim 2, wherein the hot pressing head and the heater block are made of ceramic.

5. The hot pressing tool of claim 1, wherein the hot pressing head and the heater block are integrally formed.

6. The hot pressing tool of claim 5, wherein the hot pressing head and the heater block are manufactured by molding together.

7. A hot pressing tool comprising:
   a support supporting a liquid crystal display (LCD) substrate;
   a hot pressing head attaching an anisotropic conductive film (ACF) on the liquid crystal display (LCD) substrate;
   a heater block having the same thermal expansion coefficient as the hot pressing head, the hot pressing head and the heater block being separate elements that are integral with each other, and including heaters;
   a moving block provided to be spaced apart from the heater block;
   a connection unit connecting the heater block and the moving block; and
   a transfer instrument moving the moving block up and down,
   wherein the heater block is fixed to the connection unit,
   wherein a length direction of the connection unit extends in a direction parallel to a line connecting the hot pressing head, the heater block and the moving block, and
   wherein the connection unit is a plurality of adjustment bolts capable of adjusting the interval between the moving block and the heater block, thereby adjusting the oblateness of the hot pressing head, and the adjustment bolts are arranged in a line perpendicular to the length direction.

8. The hot pressing tool of claim 7, wherein the hot pressing head and the heat block are made of the same material.

9. The hot pressing tool of claim 8, wherein the hot pressing tool and the heat block are made of stainless steel.

10. The hot pressing tool of claim 8, wherein the hot pressing tool and the heat block are made of ceramic.

11. The hot pressing tool of claim 7, wherein the hot pressing head and the heater block are manufactured by molding together.

12. An apparatus for a hot pressing head and a heater block; the pressing head and the heater block being separate elements that define an integral structure,
   the heater block being fixed to a connection unit connecting the heater block and a moving block, and
   the moving block being provided to be spaced apart from the heater block,
   wherein a length direction of the connection unit extends in a direction parallel to a line connecting the hot pressing head, the heater block and the moving block, and
   wherein the connection unit is a plurality of adjustment bolts capable of adjusting the interval between the moving block and the heater block, thereby adjusting the oblateness of the hot pressing head, and the adjustment bolts are arranged in a line perpendicular to the length direction.

13. The hot pressing tool of claim 1, wherein the heater block is fixed on the connection unit so that the heater block does not rotate relative to the connection unit.

* * * * *